US012653029B2

(12) United States Patent
Zhu

(10) Patent No.: US 12,653,029 B2
(45) Date of Patent: Jun. 9, 2026

(54) POWER BLOCK BASED ON TOP-SIDE COOL SURFACE-MOUNT DISCRETE DEVICES WITH DOUBLE-SIDED HEAT SINKING

(71) Applicant: UNITED SILICON CARBIDE, INC., Princeton, NJ (US)

(72) Inventor: Ke Zhu, Princeton, NJ (US)

(73) Assignee: UNITED SILICON CARBIDE, INC., Scottsdale, AZ (US)

( * ) Notice: Subject to any disclaimer, the term of this patent is extended or adjusted under 35 U.S.C. 154(b) by 514 days.

(21) Appl. No.: 18/183,702

(22) Filed: Mar. 14, 2023

(65) Prior Publication Data

US 2024/0030096 A1    Jan. 25, 2024

Related U.S. Application Data

(60) Provisional application No. 63/391,264, filed on Jul. 21, 2022.

(51) Int. Cl.
H10W 40/60 (2026.01)
H02M 3/158 (2006.01)
(Continued)

(52) U.S. Cl.
CPC ......... H10W 40/613 (2026.01); H02M 3/158 (2013.01); H05K 1/18 (2013.01);
(Continued)

(58) Field of Classification Search
CPC ............... H01L 23/4012; H01L 25/112; H01L 23/4006; H01L 23/5385; H02M 3/158; H05K 1/18; H05K 7/209; H05K 1/0206
(Continued)

(56) References Cited

U.S. PATENT DOCUMENTS 5,323,292 A    6/1994 Brzezinski
8,755,188 B2    6/2014 Stella
(Continued)

FOREIGN PATENT DOCUMENTS

CN    205595329 U    9/2016
CN    114447591 A  *  5/2022    ........... H05K 7/2039
(Continued)

OTHER PUBLICATIONS

Infineon, "Innovative top-side cooled package solution for high-voltage applications," AN_2101_PL52_2103_112902, Version 1.0, Sep. 30, 2021, 30 pages.
(Continued)

*Primary Examiner* — Mandeep S Buttar
*Assistant Examiner* — Kyle Oxenknecht
(74) *Attorney, Agent, or Firm* — Slayden Grubert Beard PLLC

(57)    ABSTRACT

This disclosure relates to a cooling apparatus and a method for cooling semiconductor devices, wherein the cooling apparatus is disposed over a top surface and a bottom surface of a printed circuit board. The disclosed cooling apparatus comprises a printed circuit board, a first semiconductor device comprising a first thermal pad and mounted on a top surface of the printed circuit, a second semiconductor device comprising a second thermal pad and mounted on a bottom surface of the printed circuit, a first heat sink, a first thermal interface structure thermally coupled between the first thermal pad and the first heat sink, a second heat sink, and a second thermal interface structure thermally coupled between the second thermal pad and the second heat sink.

34 Claims, 8 Drawing Sheets

(51) Int. Cl.

| | | |
|---|---|---|
| *H05K 1/18* | (2026.01) | |
| *H05K 7/20* | (2006.01) | |
| *H10W 40/20* | (2026.01) | |
| *H10W 90/00* | (2026.01) | |

(52) U.S. Cl.
CPC ............ *H05K 7/209* (2013.01); *H10W 90/00* (2026.01); *H05K 2201/09063* (2013.01); *H05K 2201/10166* (2013.01); *H05K 2201/10272* (2013.01); *H05K 2201/10393* (2013.01); *H05K 2201/10545* (2013.01); *H10W 40/242* (2026.01); *H10W 40/60* (2026.01); *H10W 40/611* (2026.01)

(58) Field of Classification Search
USPC ......................................................... 361/719
See application file for complete search history.

(56) References Cited

U.S. PATENT DOCUMENTS

| | | | | |
|---|---|---|---|---|
| 9,196,564 | B2 * | 11/2015 | Gektin | ................ H01L 23/4006 |
| 10,277,105 | B1 * | 4/2019 | Vinciarelli | .......... H01L 23/5384 |
| 10,447,170 | B1 * | 10/2019 | Wu | ................... H01L 23/49531 |
| 10,720,380 | B1 * | 7/2020 | Seal | .................... H01L 23/4952 |
| 11,477,915 | B2 * | 10/2022 | Chen | ....................... G06F 1/182 |
| 2006/0261457 | A1 | 11/2006 | Rancuret et al. | |
| 2010/0289145 | A1 * | 11/2010 | Chipalkatti | ............. H01L 23/36 |
| | | | | 257/E21.59 |
| 2013/0207612 | A1 * | 8/2013 | Lev | ........................ H02J 7/0036 |
| | | | | 429/158 |
| 2015/0092374 | A1 * | 4/2015 | Isaacs | .................... H05K 1/181 |
| | | | | 361/767 |
| 2020/0075455 | A1 | 3/2020 | Dilsch et al. | |
| 2021/0092878 | A1 * | 3/2021 | Gao | ................... H05K 7/20254 |

FOREIGN PATENT DOCUMENTS

| | | |
|---|---|---|
| EP | 2779231 A2 | 9/2014 |
| EP | 2779231 A3 | 4/2015 |
| EP | 4030264 A1 | 7/2022 |

OTHER PUBLICATIONS

Extended European Search Report for European Patent Application No. 23185614.7, mailed Dec. 1, 2023, 7 pages.

* cited by examiner

POWER BLOCK BASED ON TOP-SIDE COOL SURFACE-MOUNT DISCRETE DEVICES WITH DOUBLE-SIDED HEAT SINKING

RELATED APPLICATIONS

This application claims the benefit of provisional patent application Ser. No. 63/391,264, filed Jul. 21, 2022, the disclosure of which is hereby incorporated herein by reference in its entirety.

FIELD OF THE DISCLOSURE

The present disclosure relates to semiconductor devices. More particularly, the present disclosure relates to cooling apparatuses and methods for cooling semiconductor devices.

BACKGROUND

High-power semiconductor devices such as power transistors may generate a large amount of heat during operation, which makes thermal management an integral issue in the integration of semiconductor devices. An efficient cooling apparatus enables an increased number of semiconductor devices to be integrated as part of a printed circuit board (PCB).

To dissipate the heat generated by semiconductor devices, heat sinks are attached to top surfaces of semiconductor devices mounted over a top surface of a PCB. However, this conventional approach limits the number of semiconductor devices that can be integrated into the PCB. As the number of semiconductor devices mounted over the top surface of the PCB increases, the PCB may deform, bend, or fracture. Alternatively, designs wherein the heat dissipates through bottom surfaces of semiconductor devices suffer from a high thermal resistance associated with the PCB.

Therefore, there is a need for an improved apparatus for cooling semiconductor devices attached to a PCB.

The background description provided herein is for the purpose of generally presenting the context of the disclosure. Unless otherwise indicated herein, the materials described in this section are not prior art to the claims in this application and are not admitted to be prior art by inclusion in this section.

SUMMARY

This disclosure relates to a cooling apparatus and a method for cooling semiconductor devices, wherein the cooling apparatus is disposed over a top surface and a bottom surface of a printed circuit board. In one aspect, the disclosed cooling apparatus comprises a printed circuit board (PCB), a first semiconductor device comprising a first thermal pad and mounted on a top surface of the PCB, a second semiconductor device comprising a second thermal pad and mounted on a bottom surface of the PCB, a first heat sink, a first thermal interface structure thermally coupled between the first thermal pad and the first heat sink, a second heat sink, and a second thermal interface structure thermally coupled between the second thermal pad and the second heat sink.

In an embodiment, the cooling apparatus further comprises a plurality of fasteners that extend through the first heat sink, the printed circuit board, and the second heat sink to hold the first heat sink against the first thermal interface structure and the second heat sink against the second thermal interface structure.

According to an embodiment, the plurality of fasteners of the cooling apparatus are spring-loaded fasteners.

In another embodiment, the first thermal interface structure of the cooling apparatus comprises a first thermal interface layer, a second thermal interface layer, and a first dielectric layer between the first thermal interface layer and the second thermal interface layer, and the second thermal interface structure of the cooling apparatus comprises a third thermal interface layer, a fourth thermal interface layer, and a second dielectric layer between the third thermal interface layer and the fourth thermal interface layer.

In yet another embodiment, the first dielectric layer and the second dielectric layer comprise a ceramic.

According to yet another embodiment, the first thermal interface layer, the second thermal interface layer, the third thermal interface layer, and the fourth thermal interface layer comprise copper, aluminum, solder, or sinter.

In an embodiment, the first thermal interface layer resides within a periphery of a bottom surface of the first dielectric layer, the second thermal interface layer resides within a periphery of a top surface of the first dielectric layer, the third thermal interface layer resides within a periphery of a top surface of the second dielectric layer, and the fourth thermal interface layer resides within a periphery of a bottom surface of the second dielectric layer.

In an embodiment, the first thermal pad resides within a periphery of the first thermal interface layer, and the second thermal pad resides within a periphery of the third thermal interface layer.

According to an embodiment, the cooling apparatus further comprises a first trace on the top surface of the printed circuit board wherein a first lead frame of the first semiconductor device is electrically and mechanically coupled to the first trace, a second trace on the top surface of the printed circuit board wherein a second lead frame of the first semiconductor device is electrically and mechanically coupled to the second trace, a third trace on the bottom surface of the printed circuit board and under the first trace wherein a first lead frame of the second semiconductor device is electrically and mechanically coupled to the third trace, and a fourth trace on the bottom surface of the printed circuit board and under the second trace wherein a second lead frame of the second semiconductor device is electrically and mechanically coupled to the fourth trace.

In an embodiment the cooling apparatus further comprises a first busbar extending over a portion of the first trace, a second busbar extending over a portion of the second trace, a third busbar extending over a portion of the third trace, and a fourth busbar extending over a portion of the fourth trace.

According to another embodiment, the cooling apparatus further comprises a first busbar fastener that extends through the first busbar, the printed circuit board, and the third busbar to hold the first busbar against the first trace and the third busbar against the third trace, and a second busbar fastener that extends through the second busbar, the printed circuit board, and the fourth busbar to hold the second busbar against the second trace and the fourth busbar against the fourth trace.

In yet another embodiment, the printed circuit board further comprises a first plurality of vias that extend from the second trace to the fourth trace.

According to an embodiment, the first semiconductor device is a MOSFET having a first source terminal and a first drain terminal and the second semiconductor device is a MOSFET having a second source terminal and a second drain terminal, wherein the first lead frame of the first semiconductor device is the first drain terminal, the second lead frame of the first semiconductor device is the first source terminal, the first lead frame of the second semiconductor device is the second source terminal, and the second lead frame of the second semiconductor device is the second drain terminal to form a half-bridge circuit connection.

According to another embodiment, the first semiconductor device is a MOSFET having a first source terminal and a first drain terminal and the second semiconductor device is a MOSFET having a second source terminal and a second drain terminal, wherein the first lead frame of the first semiconductor device is the first drain terminal, the second lead frame of the first semiconductor device is the first source terminal, the first lead frame of the second semiconductor device is the second drain terminal, and the second lead frame of the second semiconductor device is the second source terminal to form a common-source circuit connection.

In an embodiment, the printed circuit board further comprises a second plurality of vias that extend from the first trace to the third trace.

According to an embodiment, the first semiconductor device is a MOSFET having a first source terminal and a first drain terminal and the second semiconductor device is a MOSFET having a second source terminal and a second drain terminal, wherein the first lead frame of the first semiconductor device is the first drain terminal, the second lead frame of the first semiconductor device is the first source terminal, the first lead frame of the second semiconductor device is the second drain terminal, and the second lead frame of the second semiconductor device is the second source terminal to form a paralleled circuit connection.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1A:
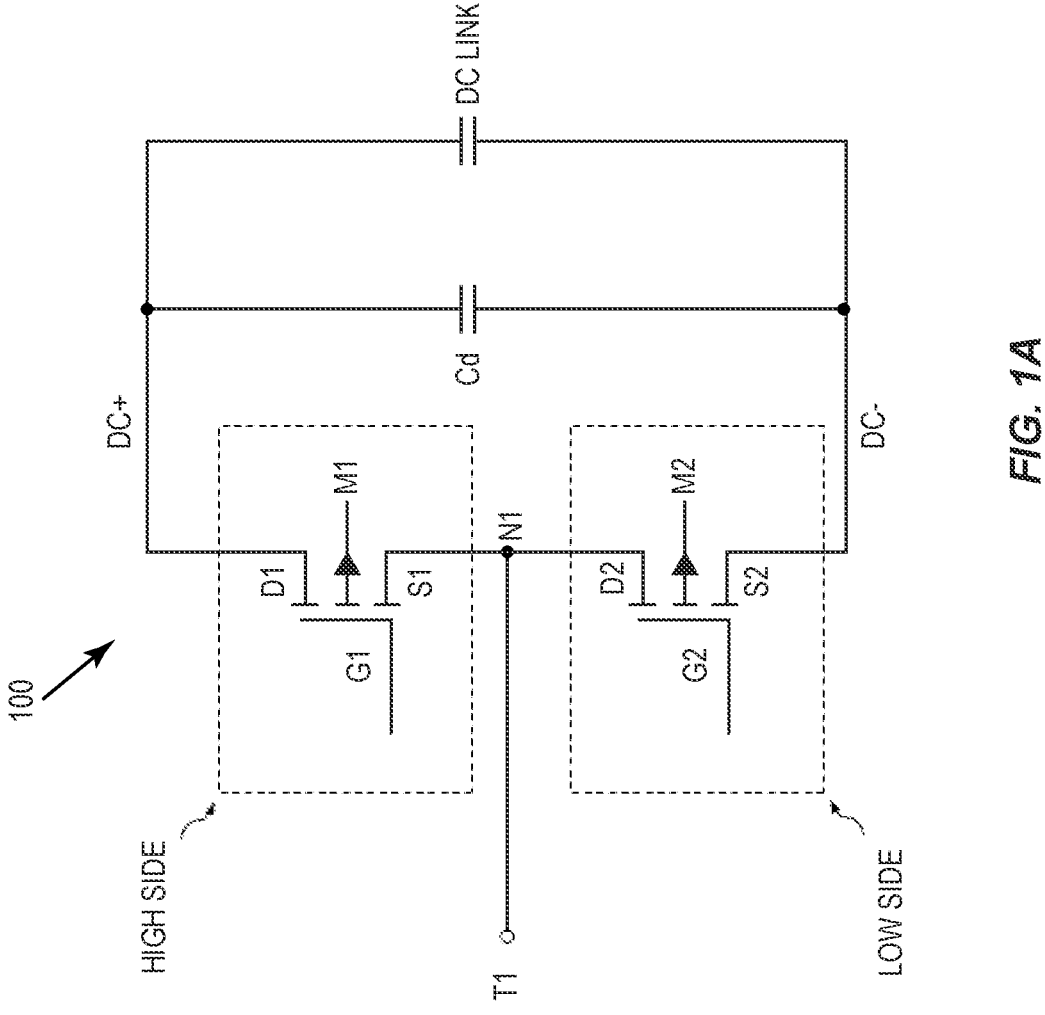
FIGS. 1A to 1C illustrate exemplary circuit topologies that are implemented in various embodiments of the present disclosure to rectify, invert, convert, or otherwise manipulate electrical energy.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Figure 1C:
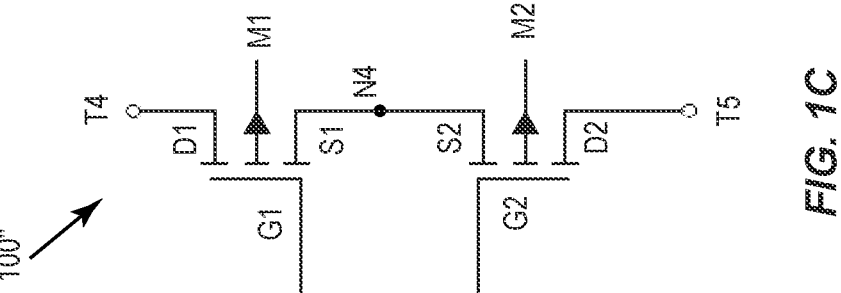
Figure 1B:
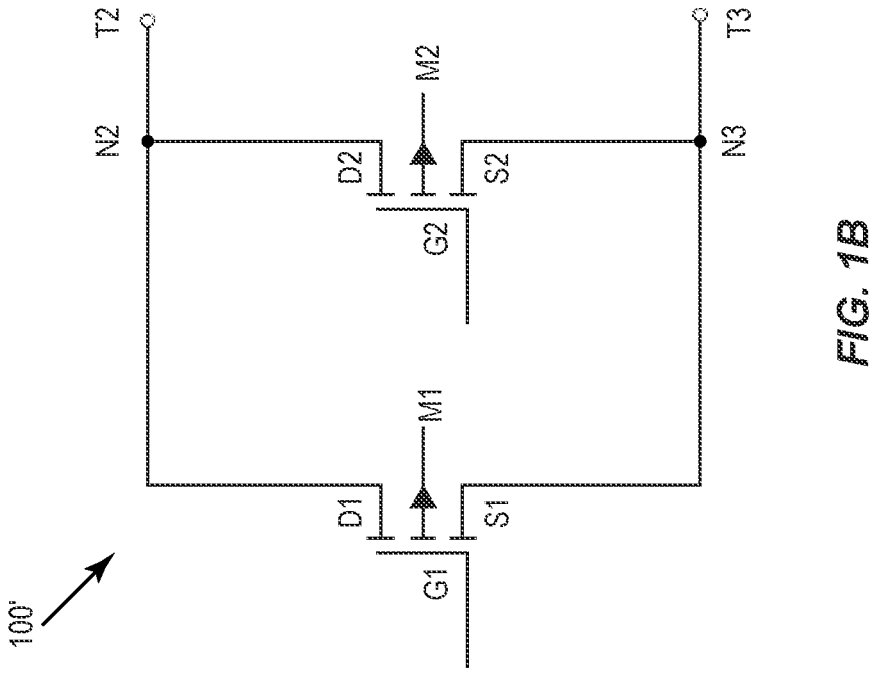

FIGS. 1A to 1C illustrate exemplary circuit topologies that are implemented in various embodiments of the present disclosure to rectify, invert, convert, or otherwise manipulate electrical energy. However, those skilled in the art will appreciate that embodiments of the present disclosure are not limited to circuit topologies of FIGS. 1A to 1C. As illustrated in FIGS. 1A to 1C, respectively, each of a half-bridge circuit topology 100, a paralleled transistor connection circuit topology 100', and a common-source circuit topology 100" comprise a first transistor and a second transistor wherein the first transistor and the second transistor may be one of metal oxide semiconductor field-effect transistors (MOSFETs), insulated gate bipolar transistors (IGBTs), junction-gate field-effect transistors (JFETs), high electron mobility transistors (HEMTs), or the like. In certain embodiments of the present disclosure that are described in reference to FIGS. 1A to 1C and in more detail elsewhere herein, the first transistor and the second transistor are power MOSFET devices that may be disposed over a top surface and a bottom surface of a printed circuit board (PCB) with a heat dissipating cooling apparatus.

Figure 2:
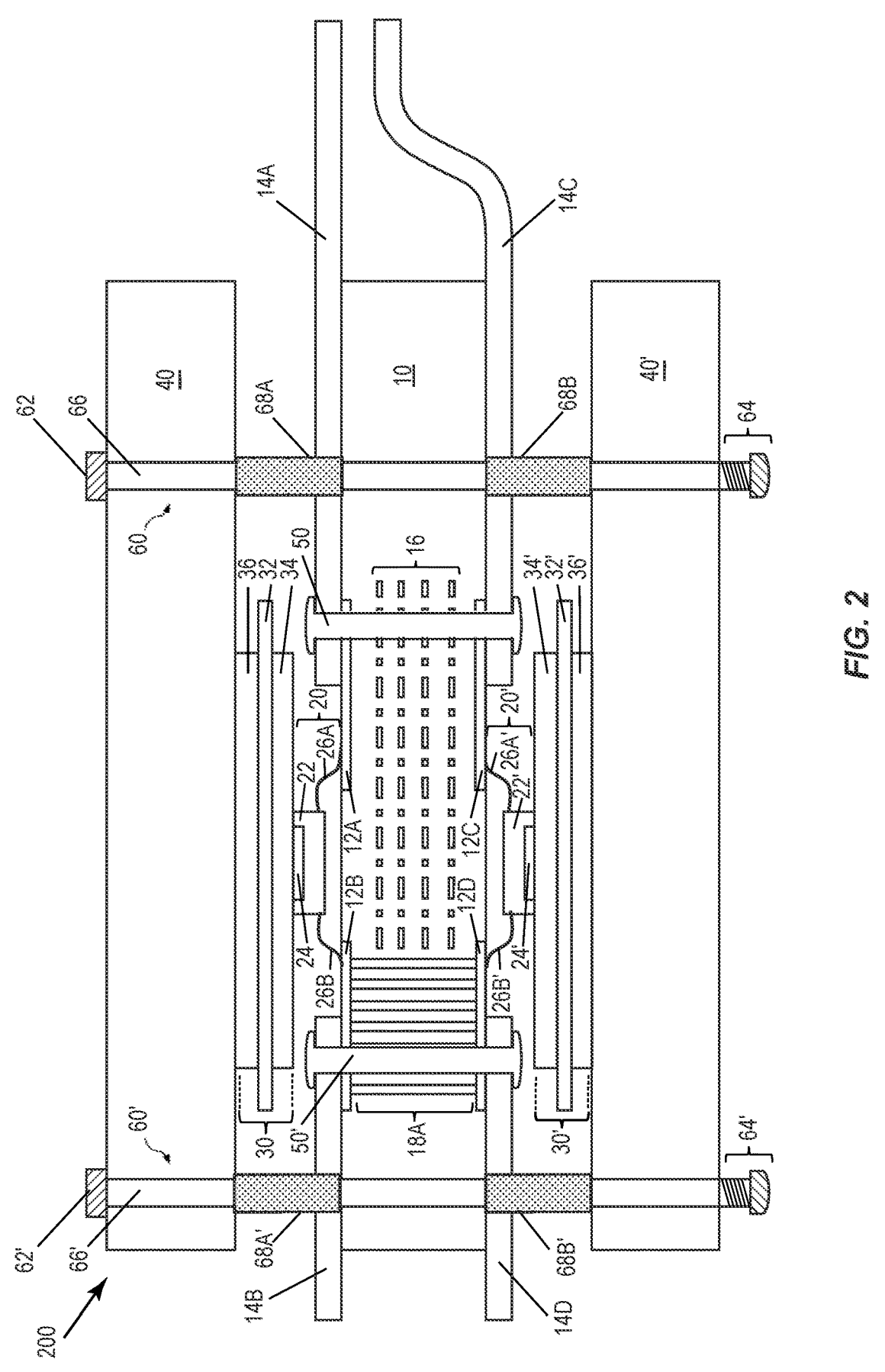
FIG. 2 shows a cross-section view of a cooling apparatus in accordance with an embodiment of the present disclosure.
Figure 3:
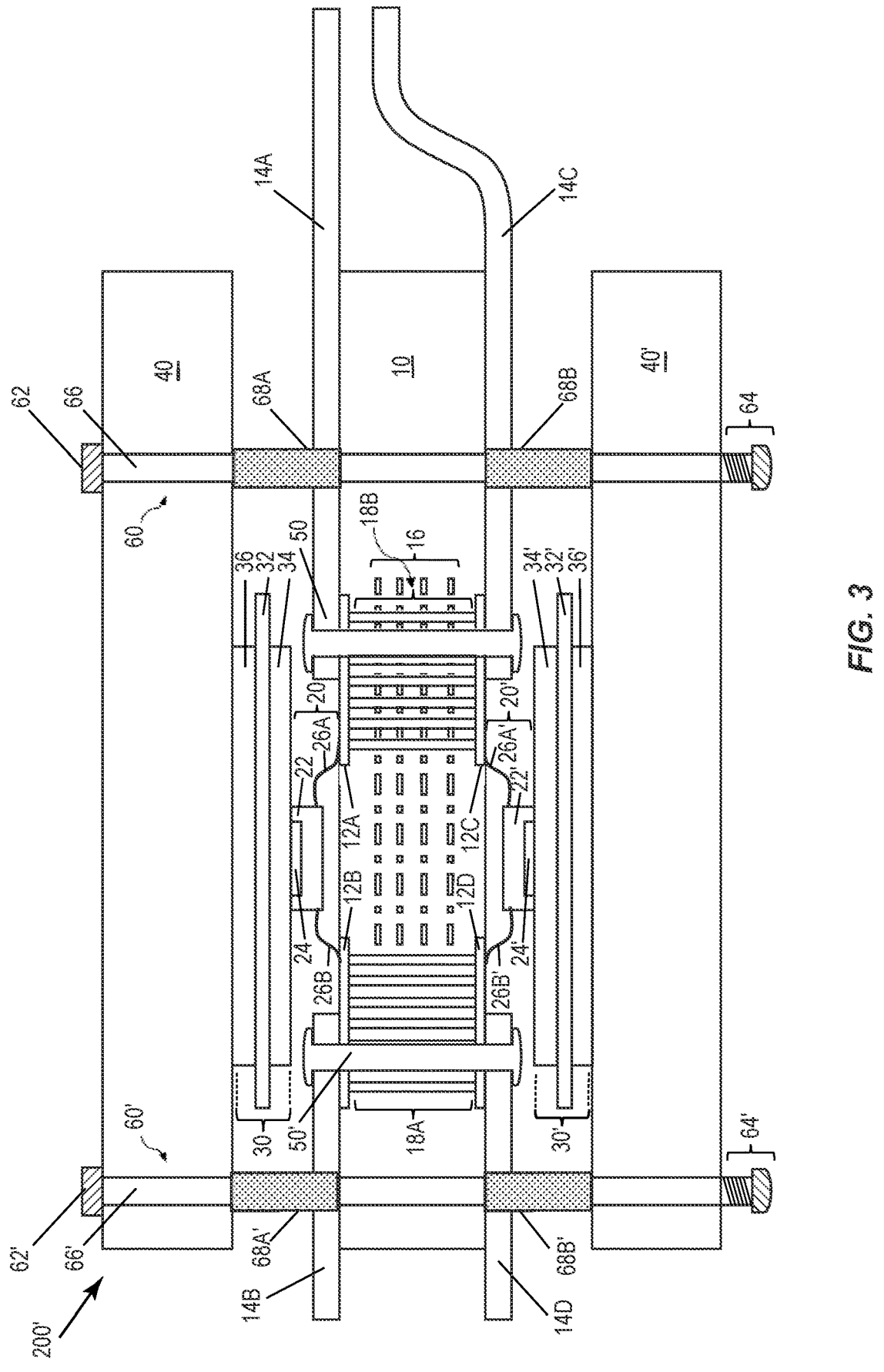
FIG. 3 illustrates an exemplary embodiment of a cooling apparatus in accordance with another embodiment of the present disclosure.

It is further noted that in FIGS. 1A to 1C, respectively, the operation of the half-bridge circuit topology 100, the paralleled transistor connection circuit topology 100', and the common-source circuit topology 100" is well known to those skilled in the art and is therefore not described herein for the sake of brevity of the description. In various embodiments of the present disclosure that are described in more detail elsewhere herein, each of the half-bridge circuit topology 100, the paralleled transistor connection circuit topology 100', and the common-source circuit topology 100" is integrated as part of a PCB embedded in the cooling apparatuses 200 or 200' as illustrated in FIGS. 2 and 3.

Referring first to FIG. 1A, the half-bridge circuit topology 100 is illustrated. The half-bridge circuit topology 100 comprises high side power semiconductor switching device labeled HIGH SIDE including a first MOSFET device M1 and low side power semiconductor switching device labeled LOW SIDE including a second MOSFET device M2, a power source in the form of a bulk capacitor bank DC LINK, and a decoupling capacitor Cd that is electrically coupled between a positive direct current (DC) busbar DC+ and a negative DC busbar DC−. The first MOSFET device M1 comprises a first gate terminal G1, a first source terminal S1, and a first drain terminal D1, and the second MOSFET device M2 comprises a second gate terminal G2, a second source terminal S2, and a second drain terminal D2. As shown, the first drain terminal D1 of the first MOSFET device M1 connects to the positive DC busbar DC+, the second source terminal S2 of the second MOSFET device M2 connects to the negative DC busbar DC−, and the first source terminal S1 of the first MOSFET device M1 connects to the second drain terminal D2 of the second MOSFET device M2 to form a phase node N1 having a phase terminal T1 connected thereto.

FIG. 1B shows the paralleled transistor connection circuit topology 100' wherein a first MOSFET device M1 and a second MOSFET device M2 are connected to form a common-source node N3 and a common-drain node N2. The first MOSFET device M1 includes a first gate terminal G1, a first source terminal S1, and a first drain terminal D1, and the second MOSFET device M2 includes a second gate terminal G2, a second source terminal S2, and a second drain terminal D2. As shown in FIG. 1B, the first drain terminal D1 of the first MOSFET device M1 and the second drain terminal D2 of the second MOSFET device M2 are electrically connected to form the common-drain node N2 and a common-drain input/output terminal T2. In a similar manner, the first source terminal S1 of the first MOSFET device M1 and the second source terminal S2 of the second MOSFET device M2 are electrically connected to form the common-source node N3 and a common-source input/output terminal T3. The paralleled transistor connection circuit topology 100' may be utilized in high power-applications wherein an individual transistor is unable to conduct a high current as required in high-power applications.

FIG. 1C illustrates the common-source circuit topology 100". As illustrated, the common-source transistor circuit topology 100" comprises a first MOSFET M1 having a first gate terminal G1, a first source terminal S1, and a first drain terminal D1 and a second MOSFET M2 having a second gate terminal G2, a second source terminal S2, and a second drain terminal D2. In this configuration, the first source S1 of the first MOSFET device M1 and the second source S2 of the second MOSFET device M2 are electrically connected to form a common-source node N4. Furthermore, the first drain D1 of the first MOSFET device M1 forms an upper input/output terminal T4, while the second drain D2 of the second MOSFET device M2 forms a lower input/output terminal T5. The upper input/output terminal T4 and the lower input/output terminal T5 may be coupled between a voltage supply (not shown) configured to provide a DC supply voltage and a load to form a bidirectional switch with an ability to block the current in both directions, providing an ON-state voltage or an OFF-state voltage.

FIG. 2 shows a cross-section view of a cooling apparatus 200 in accordance with an embodiment of the present disclosure. The cooling apparatus 200 includes a substrate such as a double-sided and multi-layered printed circuit board (PCB) 10, a first semiconductor device 20 surface-mounted over a top surface of the PCB 10, a second semiconductor device 20' surface-mounted over a bottom surface of the PCB 10, a first thermal interface structure 30, a second thermal interface structure 30', and a first heat sink 40 and a second heat sink 40' disposed over the first thermal interface structure 30 and the second thermal interface structure 30', respectively. In an implementation, as illustrated, the first thermal interface structure 30 is mechanically and thermally coupled between a top surface of the first semiconductor device 20 and the first heat sink 40, and the second thermal interface structure 30' is mechanically and thermally coupled between a top surface of the second semiconductor device 20' and the second heat sink 40'.

The symmetrical configuration of the cooling apparatus 200 with respect to the planar axis of the PCB 10 is particularly advantageous as it enables more semiconductor devices to be mounted on a single PCB, which will in turn increase the power density associated with the cooling apparatus 200 while providing a heat dissipation path for each of the first semiconductor device 20 and the second semiconductor device 20'. As will be appreciated by those of skill in the art, while only two semiconductor devices are shown in FIG. 2, the number of semiconductor devices may vary based on an application or design and in accordance with one or more embodiments of the present disclosure.

Referring now to the top surface of the PCB 10, a plurality of conductive traces including a first trace 12A and a second trace 12B are disposed over the top surface of the PCB 10 in a manner such that a gap (i.e., a horizontal distance) forms between the first trace 12A and the second trace 12B. In application, the gap between the first trace 12A and the second trace 12B over the top surface of the PCB 10 allows the first semiconductor device 20 to be electrically and mechanically coupled to exposed surfaces of the first trace 12A and the second trace 12B. Generally, plate-like busbars configured to operate as one of a positive direct current (DC) busbar (DC+), a negative DC busbar (DC−), or a phase busbar extend over the top surface and the bottom surface of the PCB 10. In this manner, a first busbar 14A extends from a first edge of the PCB 10, over a first side of the top surface of the PCB 10, and covers a portion of the first trace 12A disposed over the first side of the top surface of the PCB 10. In a similar manner, a second busbar 14B extends from a second edge of the PCB 10, over a second side of the top surface of the PCB 10, and covers a portion of the second trace 12B disposed over the second side of the top surface of the PCB 10. Each of the first busbar 14A and the second busbar 14B is conductive and forms an electrical path to the first trace 12A and the second trace 12B, respectively. Furthermore, each of the first busbar 14A and the second busbar 14B may include an external shunt contact surface (not shown) to provide an external connection for each of the electrical paths to the first trace 12A and the second trace 12B.

In a similar configuration to that described with reference to the structure of the top surface of the PCB 10 described above, the bottom surface of the PCB 10 comprises a plurality of conductive traces including a third trace 12C and a fourth trace 12D disposed over the bottom surface of the PCB 10 in a manner such that a gap (i.e., a horizontal distance) is formed between the third trace 12C and the fourth trace 12D. In application, the third trace 12C and the fourth trace 12D may be located under the first trace 12A and the second trace 12B, respectively, over the bottom surface of the PCB 10. In this manner, the second semiconductor device 20' may be electrically and mechanically coupled to exposed surfaces of the third trace 12C and the fourth trace 12D having a gap therein, such that the second semiconductor device 20' is positioned under the first semiconductor device 20 disposed over the top surface of the PCB 10 as previously described in relation to the top surface of the PCB 10. Furthermore, a third busbar 14C extends from the first edge of the PCB 10, over a first side of the bottom surface of the PCB 10, and covers a portion of the third trace 12C disposed over the first side of the bottom surface of the PCB 10. In a similar manner, a fourth busbar 14D extends from the second edge of the PCB 10, over a second side of the bottom surface of the PCB 10, and covers a portion of the fourth trace 12D disposed over the second side of the bottom surface of the PCB 10. As with the first busbar 14A and the second busbar 14B, the third busbar 14C and the fourth busbar 14D are conductive and form an electrical path to the third trace 12C and the fourth trace 12D, respectively. Furthermore, each of the third busbar 14C and the fourth busbar 14D may include an external shunt contact surface (not shown) to provide an external connection for each of the electrical paths to the third trace 12C and the fourth trace 12D.

The PCB 10 further comprises a plurality of inner dielectric and conductive layers (not shown) to form signal layers 16 within the PCB 10. It should be noted that while only four signal layers 16 are shown as part of FIG. 2, the number of signal layers 16 may vary based on an application or design in accordance with one or more embodiments of the present disclosure.

As with the configuration of FIG. 2, the cooling apparatus 200 further comprises a plurality of fasteners including a first busbar fastener 50 and a second busbar fastener 50'. In an embodiment, a first busbar fastener 50 extends through at least the first busbar 14A, the PCB 10, and the third busbar 14C to hold the first busbar 14A against the first trace 12A and over the top side of the PCB 10 and to hold the third busbar 14C against the third trace 12C and over the bottom surface of the PCB 10. In certain embodiments, the first busbar fastener 50 may also extend through the first trace 12A and the third trace 12C in addition to those elements listed above. A second busbar fastener 50' may extend through at least the second busbar 14B, the PCB 10, and the fourth busbar 14D to hold the second busbar 14B against the second trace 12B and over the top surface of the PCB 10 and to hold the fourth busbar 14D against the fourth trace 12D and over the bottom surface of the PCB 10. The second busbar fastener 50' may also extend through the second trace 12B and the fourth trace 12D in addition to those elements listed above. The first busbar fastener 50 and the second busbar fastener 50' are nonconductive. Alternatively or in addition, the first busbar fastener 50 and the second busbar fastener 50' are electrically isolated from the first busbar 14A and the third busbar 14C, and the second busbar 14B and the fourth busbar 14D, respectively. In other embodiments, other methods including but not limited to soldering, sintering, screw mounting, pressure clamping, or laser welding, or a combination thereof are used to attach the first busbar 14A and the second busbar 14B over the top surface of the PCB 10 and the third busbar 14C and the fourth busbar 14D over the bottom surface of the PCB 10.

The PCB 10 may further comprise a first plurality of vias 18A that extend vertically within the PCB 10 and between the second trace 12B and the fourth trace 12D. In this manner, the second trace 12B and therefore the second busbar 14B electrically connect to the fourth trace 12D and the fourth busbar 14D. In addition, the first plurality of vias 18A enables the first semiconductor device 20 over the top surface of the PCB 10 and the second semiconductor device 20' over the bottom surface of the PCB 10 to form a common node as may be needed in certain circuit implementations.

Referring back to FIG. 2, each of the first semiconductor device 20 and the second semiconductor device 20' may be surface mounted and top-side cooled. The first semiconductor device 20 comprises a first semiconductor die (not shown) that is encapsulated in a first device package 22 having a first thermal pad 24 that forms part of a top side of the first device package 22. The first semiconductor device 20 further comprises at least a first lead frame 26A and a second lead frame 26B configured to electrically and mechanically connect to the first trace 12A and the second trace 12B, respectively, via reflow soldering or other means such as an adhesive material. By applying a pressure force on top of the first semiconductor device 20, the first lead frame 26A and the second lead frame 26B act as springs. In this manner, the first semiconductor device 20 is pressed down to the top surface of the PCB 10. This can be particularly useful when assembling the cooling apparatus 200 wherein a pressure force may be applied to the top surfaces of the first semiconductor device 20 and the second semiconductor device 20' (which bears this same feature as disclosed in more detail in reference to the second semiconductor device 20' below).

As with the first semiconductor device 20, the second semiconductor device 20' comprises a second semiconductor die (not shown) that is encapsulated in a second device package 22' having a second thermal pad 24' that forms part of a top side of the second device package 22'. The second semiconductor device 20' further comprises at least a third lead frame 26A' and a fourth lead frame 26B' configured to electrically and mechanically connect to the third trace 12C and the fourth trace 12D, respectively, via reflow soldering or other means such as an adhesive material. By applying a pressure force on top of the second semiconductor device 20', the third lead frame 26A' and the fourth lead frame 26B' act as springs, pressing down the second semiconductor device 20' to the bottom surface of PCB 10.

In various implementations, the first device package 22 and the second device package 22' may be one of plastic dual in-line integrated circuit packages (PDIP), small outline integrated circuits (SOICs), quad flat packages (QFPs), thin QFPs (TQFPs), small shrink outline plastic packages (SSOP), thin SSOPs (TSSOPs), thin very small-outline packages (TVSOPs), or other lead-containing packages well known to those skilled in the art. In an alternative embodiment, the first semiconductor device 20 and the second semiconductor device 20' are leadless. In such an embodiment a person skilled in the art would appreciate that other means and structures including but not limited to pins to form a pin grid array (PGA), solder balls to form a ball grid array (BGA), pads to form a landed grid array (LGA), or a quad flat no-lead (QFN) array can facilitate the mounting and electrical connection of the first semiconductor device 20 and the second semiconductor device 20' to the PCB 10.

The first semiconductor device 20 and the second semiconductor device 20' may comprise a discrete power semiconductor die, which may include a single or an array of similar electronic components including but not limited to PN diodes, Schottky diodes, junction barrier Schottky diodes (JBSs), merged PIN Schottky diodes (MPS), power metal oxide semiconductor field-effect transistors (MOSFETs), bipolar junction transistors (BJTs), static induction transistors (SITs), insulated gate bipolar transistors (IGBT), high electron mobility transistors (HEMTs), or the like for use in, for example, power switches, rectifiers, inverters, and converters. In operation, the first semiconductor device 20 and the second semiconductor device 20' may be heat generating.

The first thermal pad 24 and the second thermal pad 24' may be a thermally and/or electrically conductive pad, plate, or block that is coupled thermally, directly or indirectly, to the first semiconductor die of the first semiconductor device 20 and the second semiconductor die of the second semiconductor device 20', respectively. Each of the first thermal pad 24 and the second thermal pad 24' have a top surface that may be square or rectangular with a minimum surface area of 160 mm$^2$ and a maximum surface area of 600 mm$^2$. In operation, the first thermal pad 24 and the second thermal pad 24' are configured to provide an exposed area over the top surface of the first semiconductor device 20 and the second semiconductor device 20' in order for the heat generated by the first semiconductor die and the second semiconductor die to dissipate outwardly, towards top surfaces of the first semiconductor device 20 and the second semiconductor device 20' and away from the PCB 10.

Referring now to the first thermal interface structure 30 and the second thermal interface structure 30' as part of the cooling apparatus 200, the first thermal interface structure 30 may be a multilayered structure having at least one layer of thermally conductive material and at least one layer of electrically isolating material. The first thermal interface structure 30 is coupled between the first thermal pad 24 over the top surface of the first semiconductor device 20 and the first heat sink 40. In this manner, the first thermal interface structure 30 provides an electrically isolating heat dissipating path between the first semiconductor device 20 and the first heat sink 40.

As illustrated in FIG. 2, the first thermal interface structure 30 may include a first dielectric layer 32 sandwiched between a first thermal interface layer 34 and a second thermal interface layer 36. The first thermal interface layer 34 forms a direct or indirect contact with or may reside in the periphery of the top surface of the first thermal pad 24 of the first semiconductor device 20. In this manner, the first thermal interface layer 34 provides a thermal conduction path such that the heat generated by the first semiconductor device 20 is dissipated in a direction away from the PCB 10 and toward the first heat sink 40. The second thermal interface layer 36 forms a direct or indirect contact with or may reside in periphery of a bottom surface of the first heat sink 40. The first dielectric layer 32 is disposed between and may reside in periphery of the first thermal interface layer 34 and the second thermal interface layer 36 to provide a thermal conduction path between the first thermal interface layer 34 and the second thermal interface layer 36 and to electrically isolate the first thermal interface layer 34 and therefore the first semiconductor device 20 from the second thermal interface layer 36 and therefore the first heat sink 40.

As with the first thermal interface structure 30, the second thermal interface structure 30' may be a multilayered structure having at least one layer of thermally conductive material and at least one layer of electrically isolating material. The second thermal interface structure 30' is coupled between and may reside in the periphery of the second thermal pad 24' over the top surface of the second semiconductor device 20' and the second heat sink 40'. In this manner, the second thermal interface structure 30' provides an electrically isolating heat dissipating path between the second semiconductor device 20' and the second heat sink 40'.

The second thermal interface structure 30' may include a second dielectric layer 32' sandwiched between a third thermal interface layer 34' and a fourth thermal interface layer 36'. The third thermal interface layer 34' forms a direct or indirect contact with or may reside within a periphery of the top surface of the second thermal pad 24' of the second semiconductor device 20'. In this manner, the third thermal interface layer 34' provides a thermal conduction path such that the heat generated by the second semiconductor device 20' is dissipated in a direction away from the PCB 10 and toward the second heat sink 40'. The fourth thermal interface layer 36' forms a direct or indirect contact with or may reside in periphery of a top surface of the second heat sink 40'. The second dielectric layer 32' is disposed between the third thermal interface layer 34' and the fourth thermal interface layer 36' to provide a thermal conduction path between the third thermal interface layer 34' and the fourth thermal interface layer 36' and to electrically isolate the third thermal interface layer 34' and therefore the second semiconductor device 20' from the fourth thermal interface layer 36' and therefore the second heat sink 40'.

It is to be appreciated that the first thermal interface structure 30 and the second thermal interface structure 30' may be configured such that other numbers of thermal interface layers and/or dielectric layers, more or less, can be used. It should further be appreciated that the number, material, shape, size, thickness, arrangement, and method of attachment and assembly of layers of the first thermal interface structure 30 and the second thermal interface structure 30' are non-limiting and may vary depending on the particular configuration of the cooling apparatus 200.

It is generally advantageous for the first thermal interface layer 34 and the third thermal interface layer 34' to have a surface area that is larger than that of the first thermal pad 24 and the second thermal pad 24', respectively. In operation, such larger surface area provides a maximal contact surface which in turn leads to an improved heat transfer efficiency. In this regard, coupling techniques wherein grooves, air gaps, air bubbles, and air voids are substantially filled or removed are further advantageous in improving the heat transfer efficiency between the first thermal interface layer 34 and the third thermal interface layer 34' and the first thermal pad 24 and the second thermal pad 24', respectively. Accordingly, the first thermal interface layer 34 and the third thermal interface layer 34' may be one of a dry solid or a paste or putty having a thermal conductivity of not less than 5 W/mK. Furthermore, the first thermal interface layer 34 and the third thermal interface layer 34' may have a minimum surface area of 160 mm$^2$, and a minimum thickness of 50 μm. Exemplary materials for the first thermal interface layer 34 and the third thermal interface layer 34' include but are not limited to copper, aluminum, solder, sinter, or composite materials.

Each of the second thermal interface layer 36 and the fourth thermal interface layer 36' may form a direct or indirect contact with or reside in periphery of the bottom surface of the first heat sink 40 and the top surface of the second heat sink 40', respectively, such that a thermal transition path for heat transfer from the first dielectric layer 32 and the second dielectric layer 32' to the first heat sink 40 and the second heat sink 40' is provided. The second thermal interface layer 36 and the fourth thermal interface layer 36' may be one of a dry solid or a paste or putty having a minimum surface area of 160 mm$^2$ and a minimum thickness of 50 μm. Furthermore, the second thermal interface layer 36 and the fourth thermal interface layer 36' are thermally conductive and have a minimum thermal conductivity of 5 W/mK. In certain embodiments, the second thermal interface layer 36 and the fourth thermal interface layer 36' have a greater surface area than the first thermal interface layer 34 and the third thermal interface layer 34'. Exemplary materials for the second thermal interface layer 36 and the fourth thermal interface layer 36' include but are not limited to copper, aluminum, solder, sinter, or composite materials.

The first dielectric layer 32 and the second dielectric layer 32' are thermally conductive and electrically isolating and may comprise polymers, composites, or ceramic materials including but not limited to aluminum-oxide ($AL_2O_3$), aluminum nitride (AIN), beryllium oxide (BeO) and silicon nitride ($Si_3N_4$). In operation, the first dielectric layer 32 and the second dielectric layer 32' provide thermal conduction paths, electrical isolation, and thermal and mechanical stability by reducing mechanical stress caused by differences in coefficients of thermal expansion or temperatures between the first thermal interface layer 34 and the second thermal interface layer 36, and the third thermal interface layer 34' and the fourth thermal interface layer 36', respectively.

In an embodiment, the first dielectric layer 32 has a minimum surface area that is greater than the minimum surface area of each of the first thermal interface layer 34 and the second thermal interface layer 36. Each of respective edges of the first dielectric layer 32 and the second dielectric layer 32' may extend laterally substantially parallel to or in alignment with the PCB 10, and beyond each respective edge of the first thermal interface layer 34 and the second thermal interface layer 36, and the third thermal interface layer 34' and the fourth thermal interface layer 36', respectively. In this manner, for example and as shown in FIG. 2, each respective edge of the first dielectric layer 32 and the second dielectric layer 32' extends toward the first edge and the second edge of the PCB 10 and outstretches (i.e., extends beyond) the lateral edges of the first thermal interface layer 34 and the second thermal interface layer 36, and the third thermal interface layer 34' and the fourth thermal interface layer 36', respectively. The necessity for this feature is particularly evident in the case wherein electrical isolation is at stake. As discussed immediately above, it becomes clear that the first dielectric layer 32 and the second dielectric layer 32' are utilized to electrically isolate each of the first thermal interface layer 34 and the third thermal interface layer 34' and therefore the first semiconductor device 20 and the second semiconductor device 20' from the first heat sink 40 and the second heat sink 40', respectively. In this manner, that the first dielectric layer 32 and the second dielectric layer 32' should be large enough to provide a clearance and a creepage to the first semiconductor device 20 and the second semiconductor device 20', respectively. In an embodiment, each of the first dielectric layer 32 and the second dielectric layer 32' provides a minimum clearance of 3.2 mm and a minimum creepage of 5.6 mm to the first semiconductor device 20 and the second semiconductor device 20'.

According to various embodiments, methods of attachment such as brazing, bonding, diffusion bonding, soldering, or pressure contact such as clamping, or fastening may be used to couple various inner layers of the first thermal interface structure 30 and the second thermal interface structure 30'. One skilled in the art would understand that each of the first thermal interface structure 30 and the second thermal interface structure 30' may further comprise thermal adhesives, thermal paste, or various types of gap pad, or the like to further remove air gaps, bubbles, or grooves or to mend, patch, and repair defects over coupling surfaces of the above-mentioned interlayers. Methods as discussed immediately above with regard to inner layers of the first thermal interface structure 30 and the second thermal interface structure 30' may be applied to attach the first thermal interface structure 30 and the second thermal interface structure 30' in between the top surface of the first semiconductor device 20 and the first heat sink 40, and the top surface of the second semiconductor device 20' and the second heat sink 40', respectively. Furthermore, in a similar manner, thermal adhesives, thermal paste, or various types of gap pad, or the like may be used to further remove air gaps, bubbles, or grooves or to mend, patch, and repair defects over coupling surfaces of the above-mentioned surfaces.

Returning now to the cooling apparatus 200 of FIG. 2, the first heat sink 40 and the second heat sink 40' may use a fluid medium such as air or a liquid coolant to withdraw the heat dissipated from the first semiconductor device 20 and the second semiconductor device 20' through the first thermal interface structure 30 and the second thermal interface structure 30'. In an embodiment, a solid metal sheet comprising aluminum or copper forms part of each of the first heat sink 40 and the second heat sink 40' to provide a surface to which the first thermal interface structure 30 and the second thermal interface structure 30' is coupled. Each of the first heat sink 40 and the second heat sink 40' may be a single unit structure. Alternatively, or in addition, each of the first heat sink 40 and the second heat sink 40' may be a plurality of interconnected or individual units. However, irrespective of the embodiment illustrated, the operation and construction of the first heat sink 40 and the second heat sink 40' are well known to those skilled in the art and are therefore not described in depth here for the sake of brevity of the description.

As used herein, a bottom surface of the first heat sink 40 forms a direct or an indirect contact with, at least partially, or may reside in periphery of a top surface of the second thermal interface layer 36 of the first thermal interface structure 30. In this manner, the heat generated by the semiconductor die of the first semiconductor device 20 is withdrawn by the first thermal pad 24 of the first device package 22 and is dissipated through the first thermal interface structure 30, toward the first heat sink 40, and in a direction away from the PCB 10. In a similar manner a top surface of the second heat sink 40' forms a direct or an indirect contact with, at least partially, or may reside in periphery of a bottom surface of the fourth thermal interface layer 36' of the second thermal interface structure 30'. In this manner, the heat generated by the semiconductor die of the second semiconductor device 20' is withdrawn by the second thermal pad 24' of the second device package 22' and is dissipated through the second thermal interface structure 30', toward the second heat sink 40', and in a direction away from the PCB 10. In application, fillers (not shown) including thermal adhesives, thermal pastes, filler pads, or the like may be used to fill grooves or remove air gaps, air bubbles, and air voids between the top surface of the first thermal interface structure 30 and the first heat sink 40, and the bottom surface of the second thermal interface structure 30' and the second heat sink 40'.

As with the configuration of FIG. 2, cooling apparatus 200 further comprises a first spring-loaded fastener 60 and a second spring-loaded fastener 60'. Generally, the first spring-loaded fastener 60 comprises a first bolt head 62, a first spring-loaded cap 64, a first shaft 66 having a first end and a second end, a first spacer 68A, and a second spacer 68B. As shown, the first shaft 66 is located over the first side of the PCB 10 and extends at least through the first heat sink 40, the PCB 10, and the second heat sink 40'. In this manner, the first end of the first shaft 66 couples to the first bolt head

62 over the first heat sink 40 such that the first heat sink 40 is held in a fixed lateral position. The second end of the first shaft 66 is coupled to the first spring-loaded cap 64 under the second heat sink 40' such that the second heat sink 40' is held in a fixed lateral position. In certain embodiments, the first spacer 68A and the second spacer 68B are used to electrically isolate the first shaft 66 from forming contact with the first busbar 14A and the third busbar 14C as the first shaft 66 extends through the first side of the PCB 10.

In operation and as disclosed in more detail later herein and in conjunction with the second spring-loaded fastener 60', the first spring-loaded cap 64 may be tightened to insert a downward pressure force to the first heat sink 40 and therefore the first thermal interface structure 30 and the first semiconductor device 20, and an upward pressure force to the second heat sink 40' and therefore the second thermal interface structure 30' and the second semiconductor device 20'.

As with the first spring-loaded fastener 60, the second spring-loaded fastener 60' comprises a second bolt head 62', a second spring-loaded cap 64', a second shaft 66' having a first end and a second end, a third spacer 68A', and a fourth spacer 68B'. The second shaft 66' is located over the second side of the PCB 10 and extends at least through the first heat sink 40, the PCB 10, and the second heat sink 40'. In this manner, the first end of the second shaft 66' couples to the second bolt head 62' over the first heat sink 40 such that the first heat sink 40 is held in a fixed lateral position. The second end of the second shaft 66' is coupled to the second spring-loaded cap 64' under the second heat sink 40', such that the second heat sink 40' is held in a fixed lateral position. In certain embodiments, the third spacer 68A' and the fourth spacer 68B' are used to electrically isolate the second shaft 66' from forming contact with the second busbar 14B and the fourth busbar 14D as the second shaft 66' extends through the second side of the PCB 10. Alternatively or in addition, the first spring-loaded fastener 60 and the second spring-loaded fastener 60' are not electrically conductive.

In yet another embodiment, the first spacer 68A and the third spacer 68A' may be used to adjust the thickness of layers of the first thermal interface structure 30 by removing any excess downward pressure that may be caused by the first heat sink 40. In this manner, the first spacer 68A and the third spacer 68A' maintain a desired and predetermined distance between the top surface of the PCB 10 and the first heat sink 40 in order for layers of the first thermal interface structure 30 to cure and solidify with a desired and predetermined thickness. The first spacer 68A and the third spacer 68A' may be further utilized to provide a mechanical support to hold the first heat sink 40 over the top surface of the PCB 10 to prevent any unintended tilting of the first heat sink 40 during assembly. Similarly, the second spacer 68B and the fourth spacer 68B' may be used to adjust the thickness of layers of the second thermal interface structure 30' by removing any excess upward pressure caused by the second heat sink 40'. In this manner, the second spacer 68B and the fourth spacer 68B' maintain a desired and predetermined distance between the bottom surface of the PCB 10 and the second heat sink 40' in order for layers of the second thermal interface structure 30' to cure and solidify with a desired and predetermined thickness. The second spacer 68B and the fourth spacer 68B' may be further utilized to provide a mechanical support to hold the second heat sink 40' over the bottom surface of the PCB 10 such that any unintended tilting of the second heat sink 40' during assembly is prevented.

In operation, the second spring-loaded cap 64' may be tightened to insert a downward pressure force to the first heat sink 40 and therefore the first thermal interface structure 30 and the first semiconductor device 20, and an upward pressure force to the second heat sink 40' and therefore the second thermal interface structure 30' and the second semiconductor device 20'. Such pressure force over the second side of the PCB 10 in conjunction with the pressure force exerted by the first spring-loaded fastener 60 over the first side of the PCB 10 enables the cooling apparatus 200 to form a unitary and singular structure with a certain degree of flexibility in vertical alignment offered by the spring-loaded mechanism. As is appreciated by a person skilled in the art, other means such as sealant, epoxy, solder, or other types of fasteners (such as screws or rivets) may be implemented in conjunction with the first spring-loaded fastener 60 and the second spring-loaded fastener 60' to obtain a desired assembly.

While shown with only two spring-loaded fasteners 60 and 60', it is to be understood that the scope of the present disclosure is not so limited. In other embodiments, the number, locations, and applied pressure force of spring-loaded fasteners including the first spring-loaded fastener 60 and the second spring-loaded fastener 60' is adjusted to ensure a desired mounting pressure in accordance with the number of semiconductor devices disposed over the top surface and the bottom surface of the PCB 10.

This is particularly advantageous in that it offers a method of assembly for cooling of heat-generating power semiconductor devices used in power applications. In this regard, the first heat sink 40, the first thermal interface structure 30, the first semiconductor device 20, the PCB 10, the second semiconductor device 20', the second thermal interface structure 30', and the second heat sink 40' are mechanically coupled, secured, and held in a symmetrical manner, one against another, and over the top surface and the bottom surface of the PCB 10. The symmetry in the structure of the cooling apparatus 200 prevents bending or wrappage of the PCB 10 through even distribution of vertical forces. Additionally, the cooling apparatus 200 is particularly useful in that it doubles the power density for a given surface area of the PCB 10 and can be easily scaled to adapt higher power levels and to include a higher number of semiconductor devices without a warpage or a bending of the PCB 10, as is common among conventional cooling apparatuses with semiconductor devices populated only on a single side of the PCB 10.

In an exemplary embodiment, the first semiconductor device 20 and the second semiconductor device 20' are discrete power MOSFET devices, each having three terminals including a gate terminal, a source terminal, and a drain terminal. In the same embodiment, the cooling apparatus 200 is utilized to assemble a circuit that is essentially a duplicate of the half-bridge circuit topology 100 as discussed with regard to FIG. 1A. Alternatively, the cooling apparatus 200 may be utilized to assemble a circuit that is a duplicate of a common-source circuit topology 100'' provided in FIG. 1C.

In the case of the half-bridge circuit topology 100, the first semiconductor device 20 and the second semiconductor device 20' represent the first MOSFET device M1 and the second MOSFET device M2 as illustrated in FIG. 1A. In this regard, the first busbar 14A and the third busbar 14C correspond to the positive DC busbar DC+ and the negative DC busbar DC−, respectively, that are connected to a bulk capacitor bank DC LINK (not shown in FIG. 2 for the simplicity of illustrations). Furthermore, the first lead frame

26A and the second lead frame 26B of the first semiconductor device 20 are analogous to the first drain terminal D1 and the first source terminal S1 of the first MOSFET device M1, respectively, while the third lead frame 26A' and the fourth lead frame 26B' of the second semiconductor device 20' represent the second source terminal S2 and the second drain terminal D2 of the second MOSFET M2, respectively. It is noted that the first gate terminal G1 of the first MOSFET M1 and the second gate terminal G2 of the second MOSFET M2 are not shown in FIG. 2 for the simplicity of illustration. While the circuit assembly as shown in FIG. 2 does not require a decoupling capacitor such as the decoupling capacitor Cd as shown in FIG. 1A, a resistor-capacitor (RC) snubber (not shown) may be utilized to further reduce the electromagnetic interference and enhance the electromagnetic compatibility. Alternatively or in addition, the first busbar 14A and the third busbar 14C extend to the edge of the first side of the PCB 10. The proximity of the first busbar 14A and the third 14C (due to a low thickness of the PCB 10) reduces the overall power loop inductance of the circuit. Reducing the overall power loop inductance enables fast switching speed of power MOSFETs without causing excessive voltage ringing and over-voltage stress across power MOSFETs, which improves the efficiency and reliability associated with the half-bridge circuit topology 100 as disclosed.

As shown in FIG. 2, the first plurality of vias 18A is used to electrically connect the second busbar 14B and the fourth busbar 14D to form the phase node N1 and the phase terminal T1 of the half-bridge circuit topology 100 as illustrated in FIG. 1A. In this regard, the phase terminal T1 is connected to a middle node (i.e., the phase node N1) between the high side power semiconductor switching device HIGH SIDE and the low side power semiconductor switching device LOW SIDE such that its voltage potential changes according to the switching state of the first MOSFET M1 and the second MOSFET device M2.

In operation, the DC LINK capacitor (not shown) provides a stable supply of DC voltage through the first busbar 14A and the third busbar 14C, while the first semiconductor device 20 and the second semiconductor device 20' are driven alternatively into a conduction mode with the intent of modulating the output power from the second busbar 14B and the fourth busbar 14D of the half-bridge circuit topology 100 of the cooling apparatus 200. The heat generated by each of the first semiconductor device 20 and the second semiconductor device 20' is withdrawn by the first thermal pad 24 of the first device package 22 and the second thermal pad 24' of the second device package 22' and is dissipated through the first thermal interface structure 30 and second thermal interface structure 30', toward the first heat sink 40 and the second heat sink 40' and in a direction away from the PCB 10.

Now referring to the common-source circuit topology 100'' as illustrated in FIG. 1C, the first lead frame 26A and the second lead frame 26B of the first semiconductor device 20 are analogous to the first drain terminal D1 and the first source terminal S1 of the first MOSFET device M1, respectively. The third lead frame 26A' and the fourth lead frame 26B' of the second semiconductor device 20' represent the second drain terminal D2 and the second source terminal S2 of the second MOSFET M2, respectively. It is noted that the first gate terminal G1 of the first MOSFET M1 and the second gate terminal G2 of the second MOSFET M2 are not shown in FIG. 2 for the simplicity of illustration.

In operation, the first MOSFET device M1 and the second MOSFET device M2 are connected to form a common-source node N4 as shown in FIG. 1C. In this manner, the first semiconductor device 20 and the second semiconductor device 20' form a bidirectional power switch with the intent of providing an active switch with an ability to block the current in both directions. This is particularly useful in applications requiring a switch as a solid-state circuit breaker for effective protection against a short circuit, reverse voltages, etc. Meanwhile, the heat generated by each of the first semiconductor device 20 and the second semiconductor device 20' is withdrawn by the first thermal pad 24 of the first device package 22 and the second thermal pad 24' of the second device package 22' and is dissipated through the first thermal interface structure 30 and second thermal interface structure 30' toward the first heat sink 40 and the second heat sink 40' and in a direction away from the PCB 10.

FIG. 3 illustrates an exemplary embodiment of a cooling apparatus 200' in accordance with another embodiment of the present disclosure. The cooling apparatus 200' is substantially similar to the cooling apparatus 200 as shown in FIG. 2, except for the inclusion of a second plurality of vias 18B that extends vertically within the first side of the PCB 10 to electrically connect the first trace 12A and therefore the first busbar 14A to the third trace 12C and therefore the third busbar 14C. The cooling apparatus 200' has the same reference numerals as those described in reference to FIG. 2.

In an exemplary embodiment, the cooling apparatus 200' is utilized to assemble a circuit that is essentially a duplicate of the paralleled transistor connection circuit topology 100' as discussed in reference to FIG. 1B. In this manner, the first semiconductor device 20 and the second semiconductor device 20' represent the first MOSFET device M1 and the second MOSFET device M2 as illustrated in FIG. 1B. Furthermore, the first lead frame 26A and the second lead frame 26B of the first semiconductor device 20 are analogous to the first drain terminal D1 and the first source terminal S1 of the first MOSFET device M1, respectively. The third lead frame 26A' and the fourth lead frame 26B' of the second semiconductor device 20' represent the second drain terminal D2 and the second source terminal S2 of the second MOSFET M2, respectively. It is noted that the first gate terminal G1 of the first MOSFET M1 and the second gate terminal G2 of the second MOSFET M2 are not shown in FIG. 3 for the simplicity of illustration.

As shown, the second busbar 14B and the fourth busbar 14D, and therefore the second lead frame 26B and the fourth lead frame 26B', are electrically connected using the first plurality of vias 18A to represent the common-source node N3 and the common-drain terminal T3 as provided in FIG. 1B. In a similar manner, the first busbar 14A and the third busbar 14C, and therefore the first lead frame 26A and the third lead frame 26A', are electrically connected using the second plurality of vias 18B to represent the common-drain node N2 and the common-drain terminal T2 as provided in FIG. 1B. Furthermore, it is noted that the first gate terminal G1 of the first MOSFET M1 and the second gate terminal G2 of the second MOSFET M2 are not shown in FIG. 3 for the simplicity of illustration.

This configuration is particularly useful in certain high-power applications wherein a single transistor is unable to meet the high current requirements of a device. In this manner, a plurality of discrete MOSFET devices including the first MOSFET device M1 and the second MOSFET device M2 are connected in parallel and are used to distribute a high current between the first MOSFET device M1 and the second MOSFET device M2, which leads to reducing the operating temperature and conduction losses associated with each of the plurality of transistors and to providing higher output power ratings.

In operation, the power dissipation leading to the high temperatures is detrimental to the system performance. Therefore, the cooling apparatus 200' and the paralleled transistor connection circuit topology 100' associated with the cooling apparatus 200' not only distributes an input current between the paralleled transistors (in this case MOSFETs) that are assembled over both sides of the PCB 10 to double the power density for a given surface area of the PCB 10 but also dissipates the heat generated by each of the first semiconductor device 20 and the second semiconductor device 20' from the first thermal pad 24 of the first device package 22 and the second thermal pad 24' of the second device package 22', through the first thermal interface structure 30 and second thermal interface structure 30', toward the first heat sink 40 and the second heat sink 40', and in a direction away from the PCB 10.

FIGS. 4 to 7 show top views of the cooling apparatuses 200 or 200'. In this regard, cooling apparatuses 200" and 200" illustrated in FIGS. 4 to 7 are substantially similar to cooling apparatuses 200 and 200' described in reference to FIGS. 2 and 3. All elements as shown in FIGS. 4 to 7 with respect to cooling apparatuses 200" and 200" were previously described in reference to FIGS. 2 and 3 with elements that bear the same reference numerals as those previously discussed, unless stated otherwise. Furthermore, a first plurality of semiconductor devices 20" shown in FIGS. 4 to 7 has a packaging similar to that of the first semiconductor device 20 as shown in reference to FIGS. 2 and 3. Therefore, the plurality of first semiconductor devices 20" forming part of cooling apparatuses 200" and 200" will bear the same reference numerals associated with the first semiconductor device 20 and its components for the simplicity of disclosure.

Figure 4:
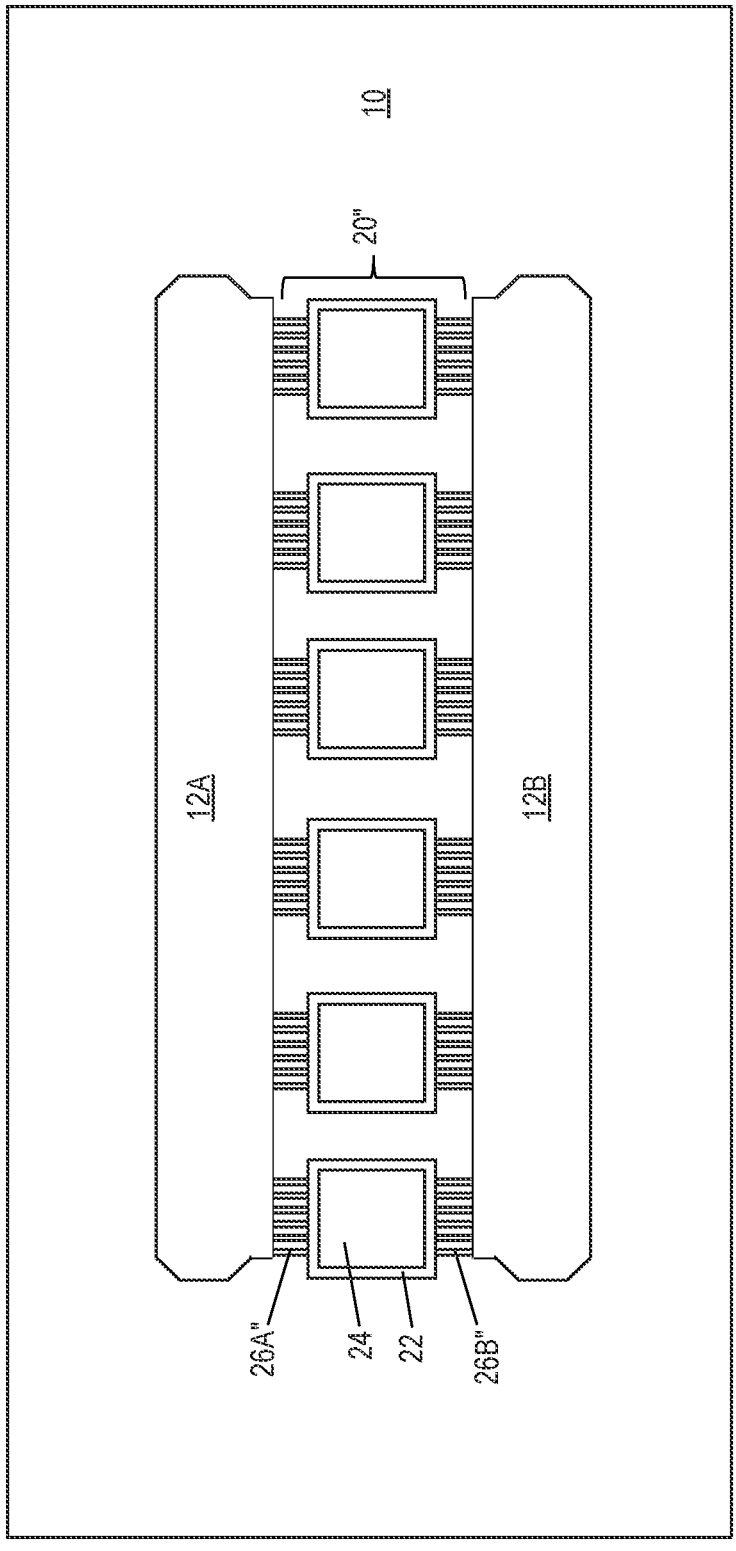
FIG. 4 illustrates a top view of a cooling apparatus comprising a first plurality of semiconductor devices disposed over a top surface of the PCB.

First referring to FIG. 4, a top view of the cooling apparatus 200 or 200' (herein referred to with a reference numeral 200") comprising a first plurality of semiconductor devices 20" disposed over a top surface of the PCB 10 is shown. The cooling apparatus 200" includes the first plurality of semiconductor devices 20" disposed over a top surface of the PCB 10 having a first plurality of lead frame terminals 26A" electrically coupled to the first trace 12A and a second plurality of lead frame terminals 26B" electrically coupled to the second trace 12B. In an embodiment, the first plurality of semiconductor devices 20" may be MOSFETs connected in parallel to enhance an overall power level associated with the first plurality of semiconductor devices 20". In an embodiment, one or more of the first plurality of lead frame terminals 26A" or the second plurality of lead frame terminals 26B" may be electrically bond wired to the first gate terminal G1 of the first MOSFET device M1 die (not shown) encapsulated within the first device package 22 and electrically isolated from the first trace 12A and the second trace 12B to form a connection with the signal layers 16 (shown as part of FIG. 2).

Figure 5:
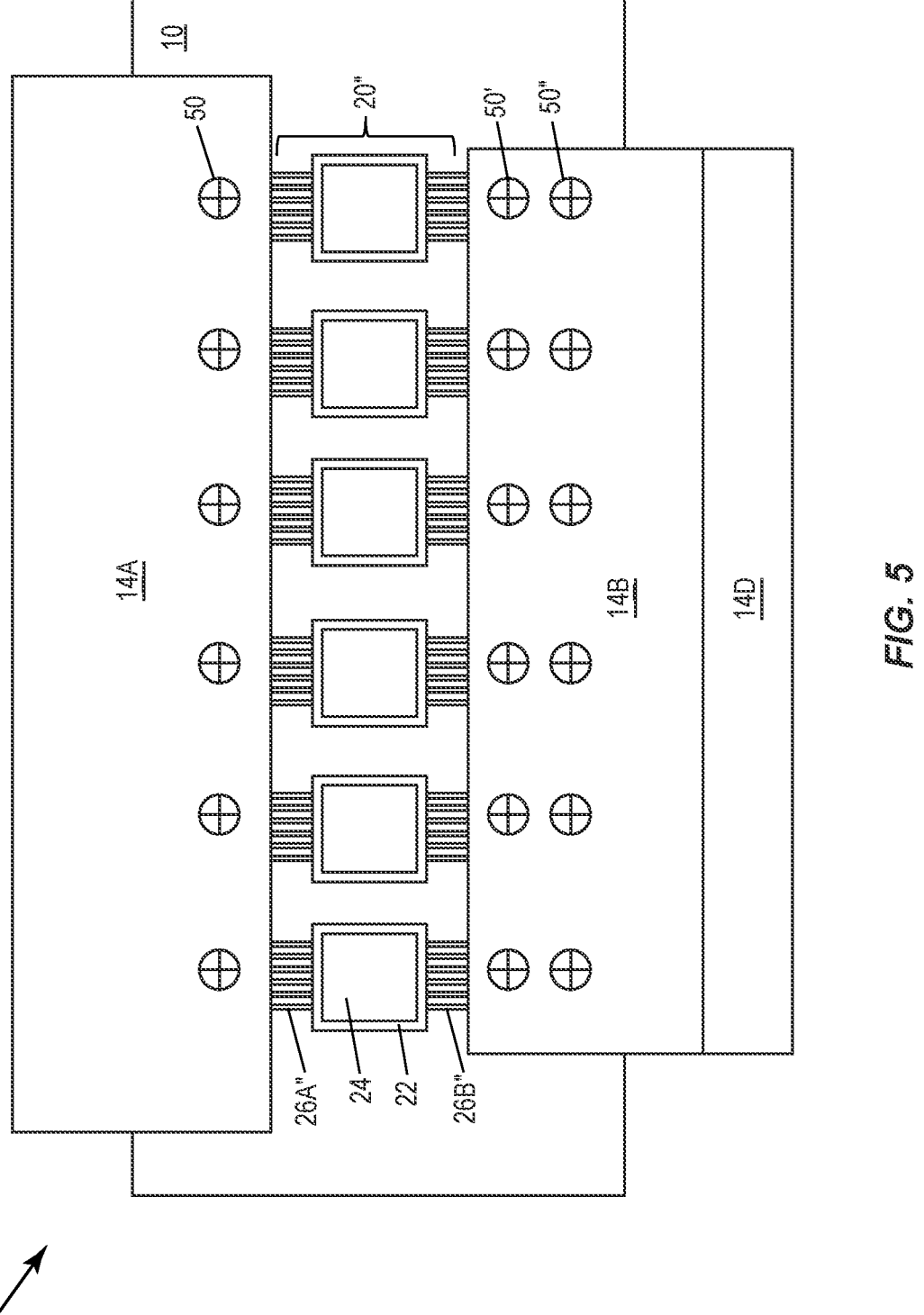
FIG. 5 illustrates a top view of a cooling apparatus having a first busbar and a second busbar disposed over a top surface of the PCB and a third busbar disposed over a bottom surface of the PCB.

FIG. 5 illustrates a top view of the cooling apparatus 200 or 200' (herein referred to with a reference numeral 200") having a first busbar 14A and a second busbar 14B disposed over a top surface of the PCB 10 and a fourth busbar 14D disposed over a bottom surface of the PCB 10. In practice, the number of first, second, and third busbar fasteners 50, 50', 50" is configured to hold the busbar against the PCB 10 and may be reduced for mass production. In an embodiment, the first, second, and third busbar fasteners 50, 50', 50" are not electrically conductive. Furthermore, locations of the first, second, and third busbar fasteners 50, 50', 50" may be adjusted to evenly distribute the pressure force across the surface of the PCB 10.

Figure 6:
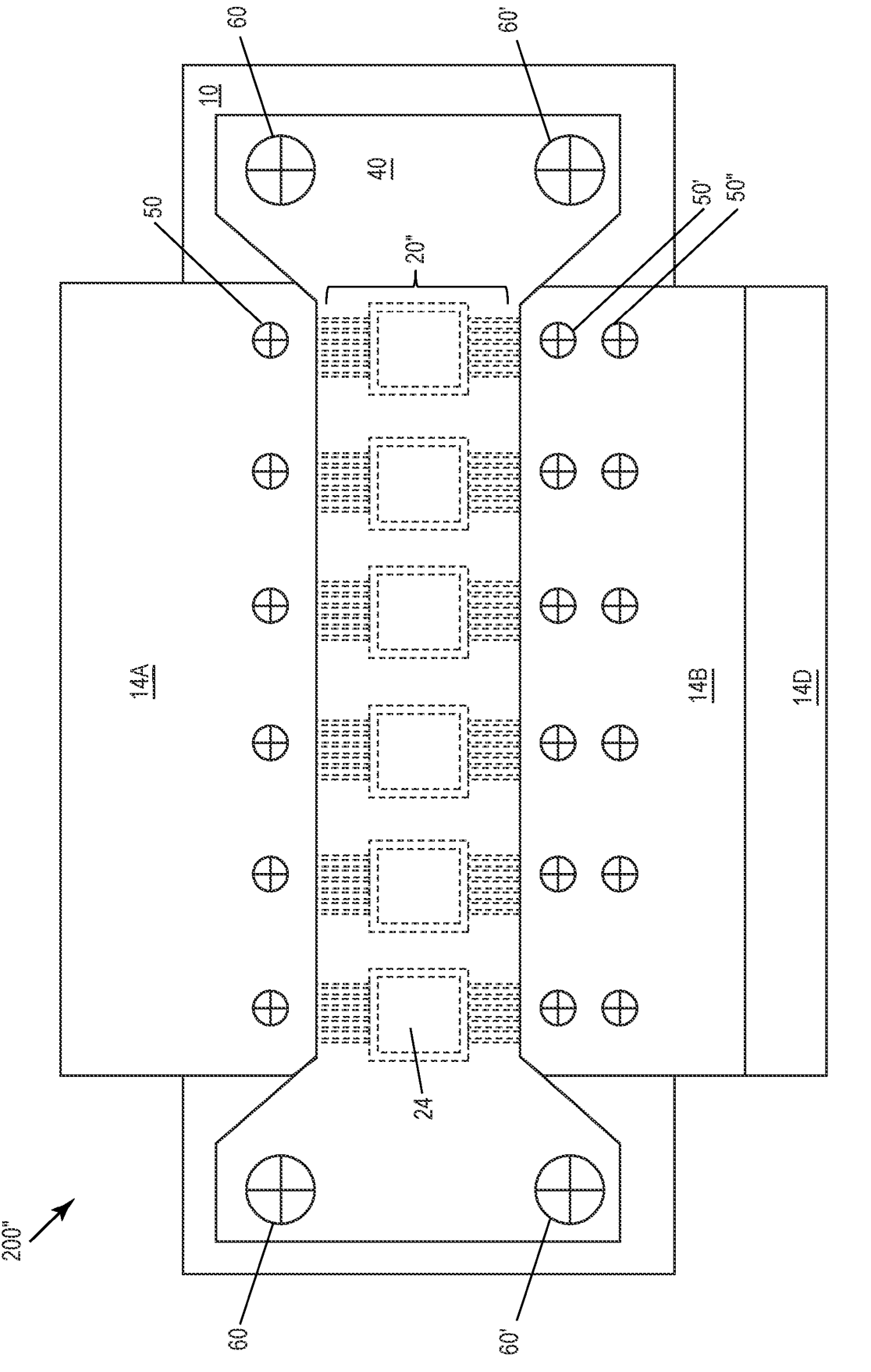
FIG. 6 illustrates a top view of a cooling apparatus having a first heat sink disposed over top surfaces of the first plurality of semiconductor devices.

FIG. 6 illustrates a top view of the cooling apparatus 200 or 200' (herein referred to with a reference numeral 200") having a first heat sink 40 disposed over top surfaces of the first plurality of semiconductor devices 20". As shown, the first heat sink 40 couples to the PCB 10 using a plurality of the spring-loaded fasteners 60, 60'. The first thermal interface structure 30 (not shown) is disposed between the first heat sink 40 and the first plurality of semiconductor devices 20". Furthermore, in an embodiment as provided in FIG. 6, the first heat sink 40 is configured in a geometrical shape such that the first, second, and third busbar fasteners 50, 50', 50" remain accessible.

Figure 7:
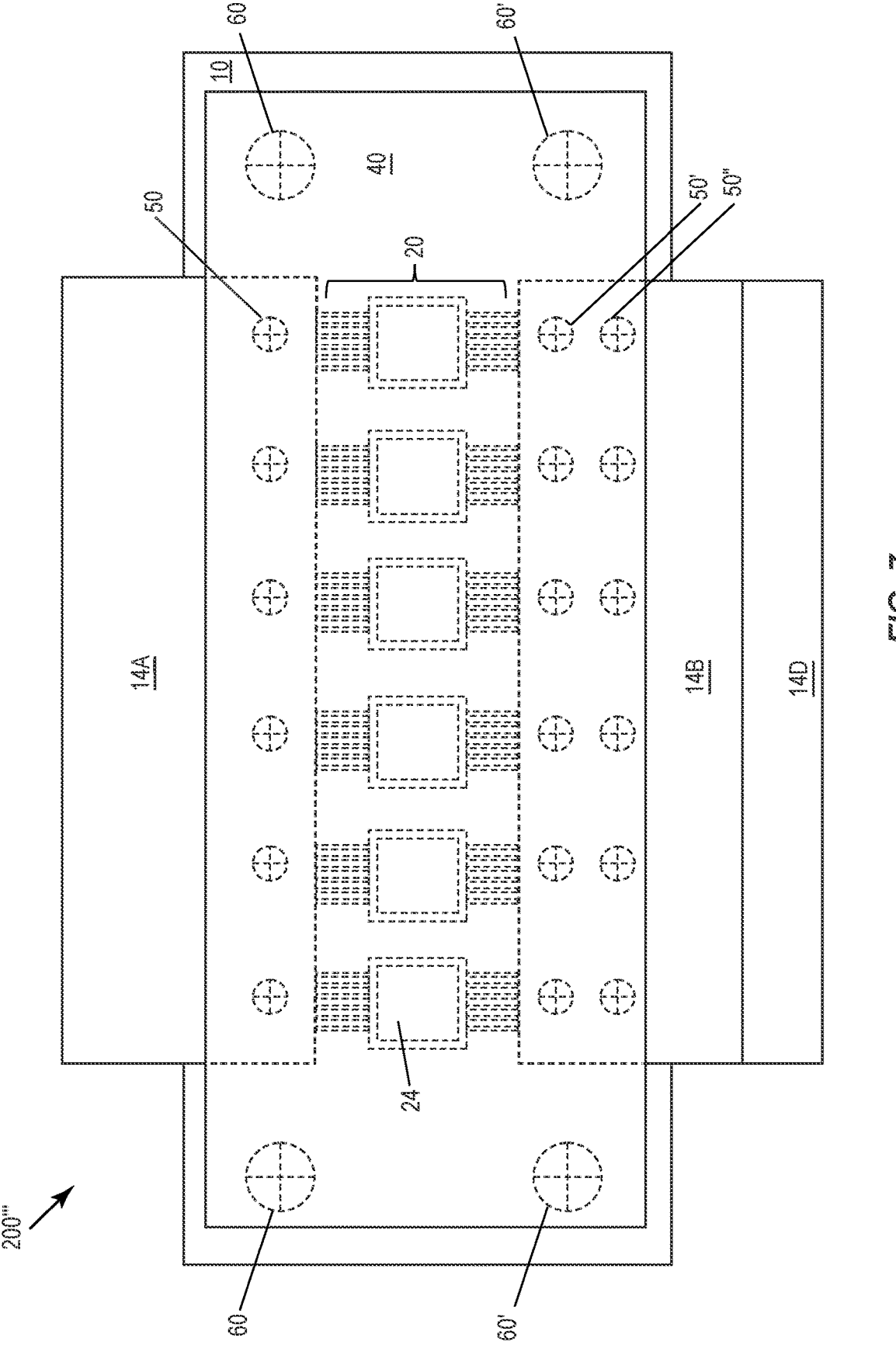
FIG. 7 illustrates an alternative top view of the cooling apparatus having a first heat sink disposed over top surfaces of the first plurality of semiconductor devices.

FIG. 7 illustrates an alternative top view of the cooling apparatus 200 or 200' (herein referred to with a reference numeral 200") wherein a first heat sink 40 is disposed over top surfaces of the first plurality of semiconductor devices 20". In this embodiment, the first heat sink 40 is configured in a geometrical shape such that the first, second, and third busbar fasteners 50, 50', 50" are not accessible.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A cooling apparatus comprising:
a printed circuit board;
a first semiconductor device mounted on a top surface of the printed circuit board, the first semiconductor device including a first semiconductor die encapsulated in a first device package and a first thermal pad forming a top side of the first device package;
a second semiconductor device mounted on a bottom surface of the printed circuit board, the second semiconductor device including a second semiconductor die encapsulated in a second device package and a second thermal pad forming a top side of the second device package;
a first heat sink;
a first thermal interface structure thermally coupled between the first thermal pad and the first heat sink;
a second heat sink; and
a second thermal interface structure thermally coupled between the second thermal pad and the second heat sink; and
wherein the second semiconductor device and second thermal interface structure are arranged on a bottom side of the printed circuit board in a respectively symmetric manner relative to the first semiconductor device and the first thermal interface structure arranged on a top side of the printed circuit board.

2. The cooling apparatus of claim 1 further comprising a plurality of fasteners that extend through the first heat sink, the printed circuit board, and the second heat sink to hold the first heat sink against the first thermal interface structure and the second heat sink against the second thermal interface structure.

3. The cooling apparatus of claim 2 wherein the plurality of fasteners are spring-loaded fasteners.

4. The cooling apparatus of claim 1 wherein:
the first thermal interface structure comprises a first thermal interface layer, a second thermal interface layer, and a first dielectric layer between the first thermal interface layer and the second thermal interface layer; and
the second thermal interface structure comprises a third thermal interface layer, a fourth thermal interface layer, and a second dielectric layer between the third thermal interface layer and the fourth thermal interface layer.

5. The cooling apparatus of claim 4 wherein the first dielectric layer and the second dielectric layer comprise a ceramic.

6. The cooling apparatus of claim 5 wherein the first thermal interface layer, the second thermal interface layer, the third thermal interface layer, and the fourth thermal interface layer comprise copper, aluminum, solder, or sinter.

7. The cooling apparatus of claim 4 wherein:
the first thermal interface layer resides within a periphery of a bottom surface of the first dielectric layer;
the second thermal interface layer resides within a periphery of a top surface of the first dielectric layer;
the third thermal interface layer resides within a periphery of a top surface of the second dielectric layer; and
the fourth thermal interface layer resides within a periphery of a bottom surface of the second dielectric layer.

8. The cooling apparatus of claim 7 wherein:
the first thermal pad resides within a periphery of the first thermal interface layer; and
the second thermal pad resides within a periphery of the third thermal interface layer.

9. The cooling apparatus of claim 8 wherein the first dielectric layer and the second dielectric layer comprise a ceramic.

10. The cooling apparatus of claim 9 further comprising a plurality of fasteners that extend through the first heat sink, the printed circuit board, and the second heat sink to hold the first heat sink against the first thermal interface structure and the second heat sink against the second thermal interface structure.

11. The cooling apparatus of claim 10 wherein the plurality of fasteners are spring-loaded fasteners.

12. The cooling apparatus of claim 4 wherein:
the first thermal pad resides within a periphery of the first thermal interface layer; and
the second thermal pad resides within a periphery of the third thermal interface layer.

13. The cooling apparatus of claim 1 further comprising:
a first trace on the top surface of the printed circuit board, wherein a first lead frame of the first semiconductor device is electrically and mechanically coupled to the first trace;
a second trace on the top surface of the printed circuit board, wherein a second lead frame of the first semiconductor device is electrically and mechanically coupled to the second trace;
a third trace on the bottom surface of the printed circuit board and under the first trace, wherein a first lead frame of the second semiconductor device is electrically and mechanically coupled to the third trace; and
a fourth trace on the bottom surface of the printed circuit board and under the second trace, wherein a second lead frame of the second semiconductor device is electrically and mechanically coupled to the fourth trace.

14. The cooling apparatus of claim 13 further comprising:
a first busbar extending over a portion of the first trace;
a second busbar extending over a portion of the second trace;
a third busbar extending over a portion of the third trace; and
a fourth busbar extending over a portion of the fourth trace.

15. The cooling apparatus of claim 14 further comprising:
a first busbar fastener that extends through the first busbar, the printed circuit board, and the third busbar to hold the first busbar against the first trace and the third busbar against the third trace; and
a second busbar fastener that extends through the second busbar, the printed circuit board, and the fourth busbar to hold the second busbar against the second trace and the fourth busbar against the fourth trace.

16. The cooling apparatus of claim 15 wherein the printed circuit board further comprises a first plurality of vias that extend from the second trace to the fourth trace.

17. The cooling apparatus of claim 16 wherein the first semiconductor device is a MOSFET having a first source terminal and a first drain terminal; and
the second semiconductor device is a MOSFET having a second source terminal and a second drain terminal; and
wherein the first lead frame of the first semiconductor device is the first drain terminal, the second lead frame of the first semiconductor device is the first source terminal, the first lead frame of the second semiconductor device is the second source terminal, and the second lead frame of the second semiconductor device is the second drain terminal to form a half-bridge circuit connection.

18. The cooling apparatus of claim 16 wherein the first semiconductor device is a MOSFET having a first source terminal and a first drain terminal; and
the second semiconductor device is a MOSFET having a second source terminal and a second drain terminal; and
wherein the first lead frame of the first semiconductor device is the first drain terminal, the second lead frame of the first semiconductor device is the first source terminal, the first lead frame of the second semiconductor device is the second drain terminal, and the second lead frame of the second semiconductor device is the second source terminal to form a common-source circuit connection.

19. The cooling apparatus of claim 16 wherein the printed circuit board further comprises a second plurality of vias that extend from the first trace to the third trace.

20. The cooling apparatus of claim 19 wherein the first semiconductor device is a MOSFET having a first source terminal and a first drain terminal; and
the second semiconductor device is a MOSFET having a second source terminal and a second drain terminal; and
wherein the first lead frame of the first semiconductor device is the first drain terminal, the second lead frame of the first semiconductor device is the first source terminal, the first lead frame of the second semiconductor device is the second drain terminal, and the second lead frame of the second semiconductor device is the second source terminal to form a paralleled circuit connection.

21. The cooling apparatus of claim 13 wherein the printed circuit board further comprises a first plurality of vias that extend from the second trace to the fourth trace.

22. The cooling apparatus of claim 21 wherein the first semiconductor device is a MOSFET having a first source terminal and a first drain terminal; and
the second semiconductor device is a MOSFET having a second source terminal and a second drain terminal; and
wherein the first lead frame of the first semiconductor device is the first drain terminal, the second lead frame of the first semiconductor device is the first source terminal, the first lead frame of the second semiconductor device is the second source terminal, and the second lead frame of the second semiconductor device is the second drain terminal to form a half-bridge circuit connection.

23. The cooling apparatus of claim 21 wherein the first semiconductor device is a MOSFET having a first source terminal and a first drain terminal; and
the second semiconductor device is a MOSFET having a second source terminal and a second drain terminal; and
wherein the first lead frame of the first semiconductor device is the first drain terminal, the second lead frame of the first semiconductor device is the first source terminal, the first lead frame of the second semiconductor device is the second drain terminal, and the second lead frame of the second semiconductor device is the second source terminal to form a common-source circuit connection.

24. The cooling apparatus of claim 21 wherein the printed circuit board further comprises a second plurality of vias that extend from the first trace to the third trace.

25. The cooling apparatus of claim 24 wherein the first semiconductor device is a MOSFET having a first source terminal and a first drain terminal; and
the second semiconductor device is a MOSFET having a second source terminal and a second drain terminal; and
wherein the first lead frame of the first semiconductor device is the first drain terminal, the second lead frame of the first semiconductor device is the first source terminal, the first lead frame of the second semiconductor device is the second drain terminal, and the second lead frame of the second semiconductor device is the second source terminal to form a paralleled circuit connection.

26. The cooling apparatus of claim 1 further comprising a plurality of fasteners that extend through the first heat sink, the printed circuit board, and the second heat sink to hold the first heat sink against the first thermal interface structure and the second heat sink against the second thermal interface structure, wherein:
the first thermal interface structure comprises a first thermal interface layer, a second thermal interface layer, and a first dielectric layer between the first thermal interface layer and the second thermal interface layer; and
the second thermal interface structure comprises a third thermal interface layer, a fourth thermal interface layer, and a second dielectric layer between the third thermal interface layer and the fourth thermal interface layer.

27. The cooling apparatus of claim 26 wherein the plurality of fasteners are spring-loaded fasteners.

28. The cooling apparatus of claim 27 further comprising:

a first trace on the top surface of the printed circuit board, wherein a first lead frame of the first semiconductor device is electrically and mechanically coupled to the first trace;

a second trace on the top surface of the printed circuit board, wherein a second lead frame of the first semiconductor device is electrically and mechanically coupled to the second trace;

a third trace on the bottom surface of the printed circuit board and under the first trace, wherein a first lead frame of the second semiconductor device is electrically and mechanically coupled to the third trace; and a fourth trace on the bottom surface of the printed circuit board and under the second trace, wherein a second lead frame of the second semiconductor device is electrically and mechanically coupled to the fourth trace.

29. The cooling apparatus of claim 28 further comprising:

a first busbar extending over a portion of the first trace;

a second busbar extending over a portion of the second trace;

a third busbar extending over a portion of the third trace; and a fourth busbar extending over a portion of the fourth trace.

30. The cooling apparatus of claim 29 further comprising:

a first busbar fastener that extends through the first busbar, the printed circuit board, and the third busbar to hold the first busbar against the first trace and the third busbar against the third trace; and a second busbar fastener that extends through the second busbar, the printed circuit board, and the fourth busbar to hold the second busbar against the second trace and the fourth busbar against the fourth trace.

31. The cooling apparatus of claim 30 further comprising a plurality of spring-loaded fasteners that extend through the first heat sink, the printed circuit board, and the second heat sink to hold the first heat sink against the first thermal interface structure and the second heat sink against the second thermal interface structure.

32. The cooling apparatus of claim 26 wherein the plurality of fasteners are spring-loaded fasteners.

33. The cooling apparatus of claim 1, wherein the second heat sink is arranged on the bottom side of the printed circuit board in a symmetric manner relative to the first heat sink arranged on the top side of the printed circuit board.

34. A method for cooling semiconductor devices comprising:

providing a printed circuit board having a top surface and a bottom surface;

providing a first semiconductor device mounted on the top surface, the first semiconductor device including a first semiconductor die encapsulated in a first device package and a first thermal pad forming a top side of the first device package;

providing a second semiconductor device mounted on the bottom surface, the second semiconductor device including a second semiconductor die encapsulated in a second device package and a second thermal pad forming a top side of the second device package;

providing a first thermal interface structure thermally coupled to the first thermal pad;

providing a second thermal interface structure thermally coupled to the second thermal pad; and wherein the second semiconductor device and second thermal interface structure are arranged on a bottom side of the printed circuit board in a respectively symmetric manner relative to the first semiconductor device and the first thermal interface structure arranged on a top side of the printed circuit board.

* * * * *